United States Patent
We et al.

(10) Patent No.: US 12,518,917 B2
(45) Date of Patent: Jan. 6, 2026

(54) METHOD TO FORM MULTIPLE ELECTRICAL COMPONENTS AND A SINGLE ELECTRICAL COMPONENT MADE BY THE METHOD

(71) Applicant: CYNTEC CO., LTD., Hsinchu (TW)

(72) Inventors: Chih Hung We, Hsinchu (TW); Min Lian Kuo, Hsinchu (TW)

(73) Assignee: CYNTEC CO., LTD., Hsinchu (TW)

( * ) Notice: Subject to any disclaimer, the term of this patent is extended or adjusted under 35 U.S.C. 154(b) by 570 days.

(21) Appl. No.: 17/165,936

(22) Filed: Feb. 3, 2021

(65) Prior Publication Data
US 2022/0051841 A1    Feb. 17, 2022

Related U.S. Application Data

(60) Provisional application No. 63/065,496, filed on Aug. 14, 2020.

(51) Int. Cl.
| | | |
|---|---|---|
| H01F 27/28 | (2006.01) | |
| H01F 27/255 | (2006.01) | |
| H01F 41/02 | (2006.01) | |
| H05K 1/09 | (2006.01) | |
| H05K 1/11 | (2006.01) | |
| H05K 1/18 | (2006.01) | |
| H05K 3/34 | (2006.01) | |
| H05K 3/40 | (2006.01) | |
| H01F 1/22 | (2006.01) | |

(52) U.S. Cl.
CPC ....... *H01F 41/0233* (2013.01); *H01F 27/255* (2013.01); *H01F 41/0246* (2013.01); *H05K 1/09* (2013.01); *H05K 1/111* (2013.01); *H05K 1/18* (2013.01); *H05K 3/341* (2013.01); *H05K 3/40* (2013.01); *H01F 1/22* (2013.01); *H05K 2201/09009* (2013.01); *H05K 2201/10007* (2013.01)

(58) Field of Classification Search
CPC ............... H01M 50/531; H01F 27/255; H01F 41/0233; H01F 41/0246; H01F 1/22; H01F 17/04; H01F 27/266; H01F 27/306; H01F 2017/048; H01F 3/10; H01F 27/24; H05K 3/40; H05K 2201/09009; H05K 2201/10007; Y02E 60/10
USPC .......................................... 336/221, 83, 232
See application file for complete search history.

(56) References Cited

U.S. PATENT DOCUMENTS

| | | | | |
|---|---|---|---|---|
| 2010/0259351 | A1* | 10/2010 | Bogert | H01F 5/003 336/200 |
| 2012/0126925 | A1* | 5/2012 | Choi | H01F 27/303 336/212 |
| 2014/0313002 | A1* | 10/2014 | Kuo | H01F 27/385 336/178 |
| 2015/0213942 | A1* | 7/2015 | Kuroda | H01F 37/00 336/212 |
| 2016/0086716 | A1* | 3/2016 | Choi | H01F 17/0013 427/127 |

(Continued)

*Primary Examiner* — Shawki S Ismail
*Assistant Examiner* — Kazi S Hossain
(74) *Attorney, Agent, or Firm* — Min-Lee Teng

(57) ABSTRACT

A method to form a plurality of inductors in a single process by stacking multiple magnetic sheets, wherein each sheet is made to form a particular part in quantities, which can be a base part, a pillar part, a hollow part, or a cover part, for forming a magnetic body of an inductor.

12 Claims, 15 Drawing Sheets

(56) References Cited

U.S. PATENT DOCUMENTS

| | | | | |
|---|---|---|---|---|
| 2016/0141087 | A1* | 5/2016 | Liu | H01F 27/255 336/83 |
| 2016/0180995 | A1* | 6/2016 | Park | H01F 17/0013 29/606 |
| 2017/0365388 | A1* | 12/2017 | Kapoor | H01F 17/06 |
| 2018/0286573 | A1* | 10/2018 | Miyazaki | H01F 41/061 |
| 2018/0322998 | A1* | 11/2018 | Yamashita | H01F 41/04 |
| 2018/0336983 | A1* | 11/2018 | Kuromiya | B22F 3/24 |
| 2019/0287709 | A1* | 9/2019 | Wu | H01F 27/255 |
| 2019/0304659 | A1* | 10/2019 | Tonogai | H01F 27/2823 |
| 2019/0304669 | A1* | 10/2019 | Hirama | H01F 41/061 |

* cited by examiner

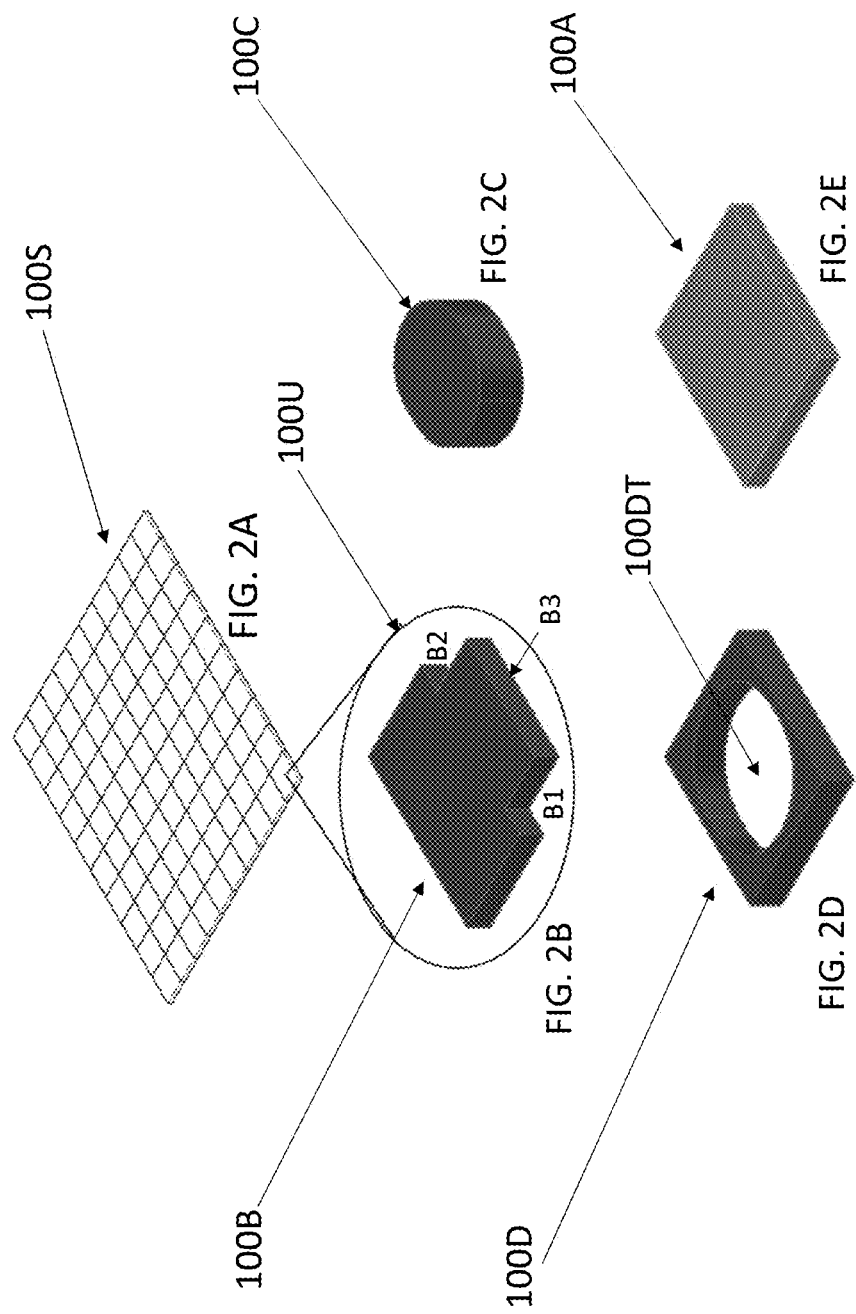

Forming a first magnetic sheet, wherein a plurality of bases are formed in the first magnetic sheet; forming a second magnetic sheet, wherein a plurality of pillars are formed in the second magnetic sheet; forming a third magnetic sheet, wherein a plurality of through openings are formed in the third magnetic sheet; and forming a fourth magnetic sheet, wherein a plurality of covers are formed in the fourth magnetic sheet

↓

Stacking the first magnetic sheet, the second magnetic sheet, the third magnetic sheet and the fourth magnetic sheet for forming a magnetic body with a plurality of coils disposed in the magnetic body

↓

Cutting the magnetic body into a plurality of pieces with each piece comprising a corresponding coil encapsulated by a corresponding portion of the magnetic body

FIG.3

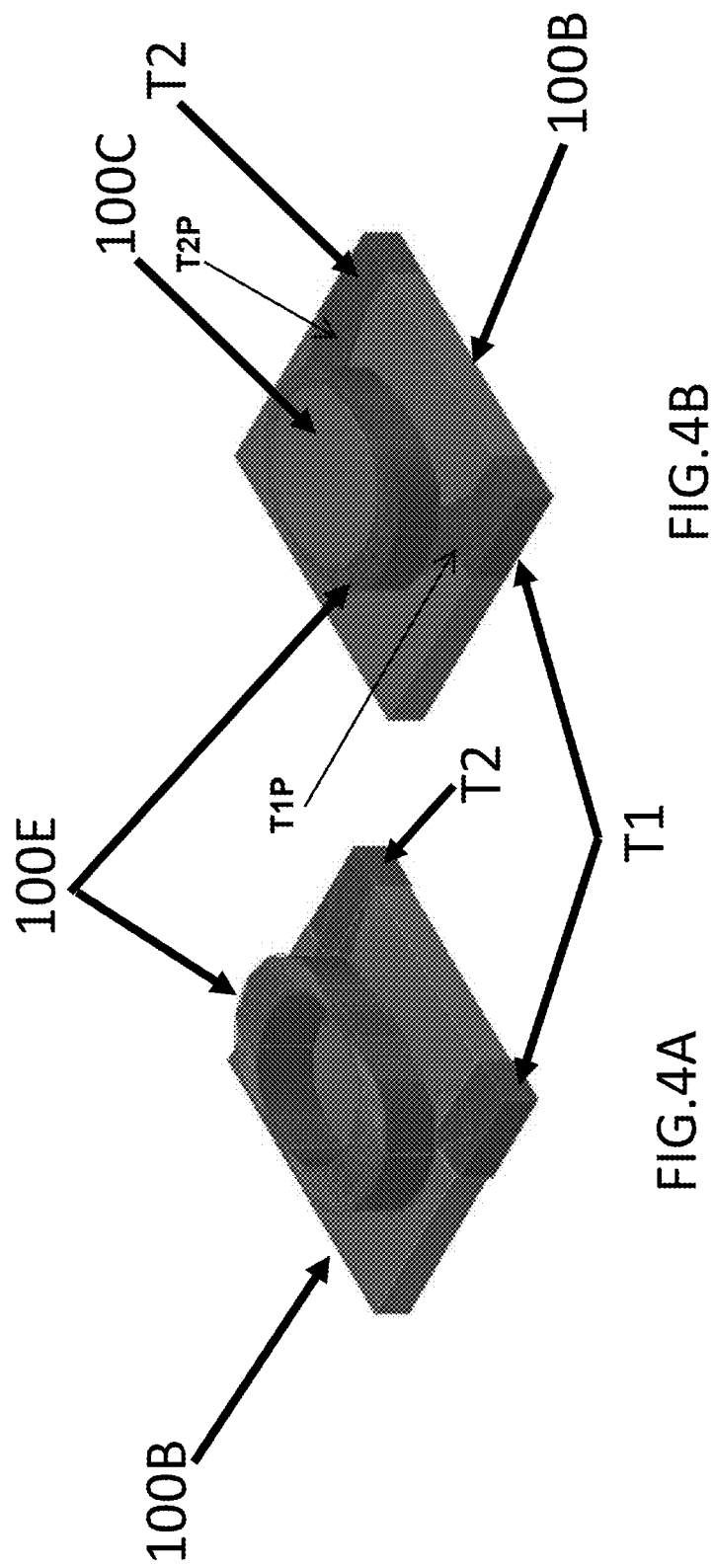

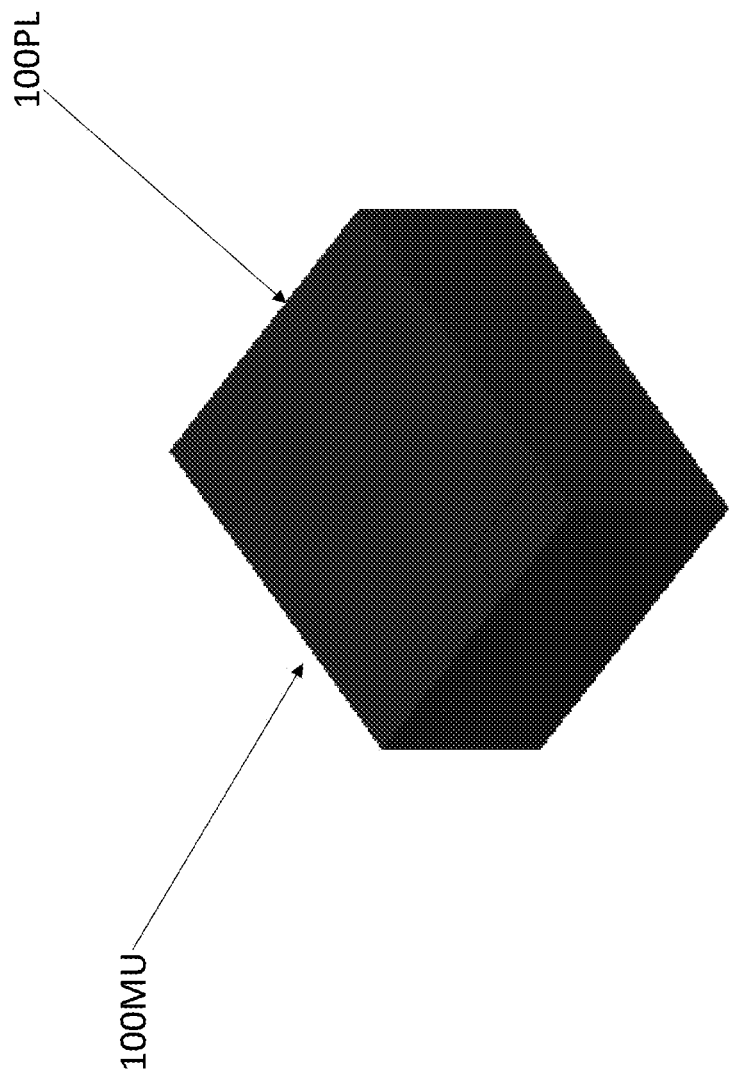

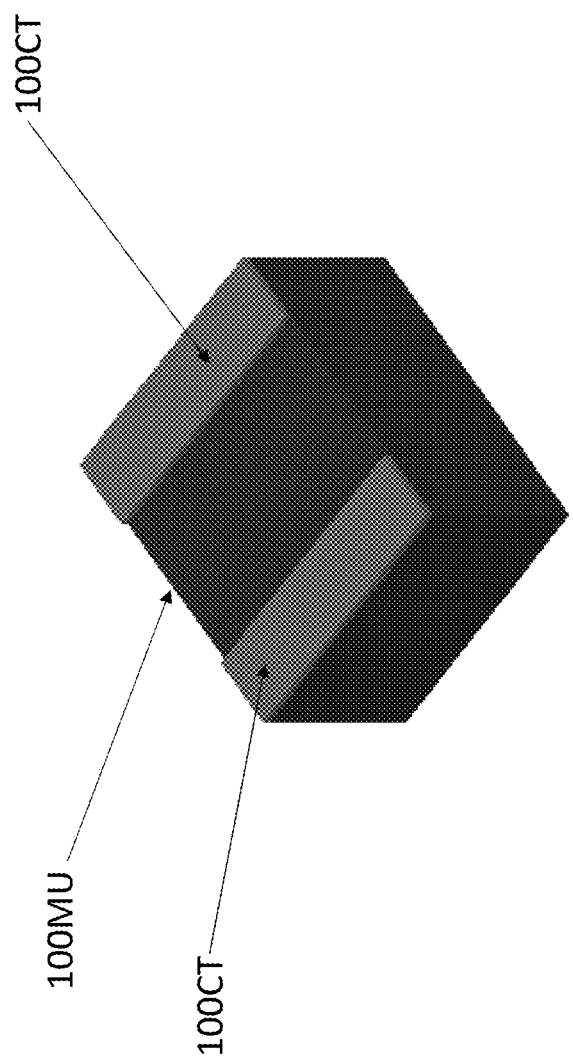

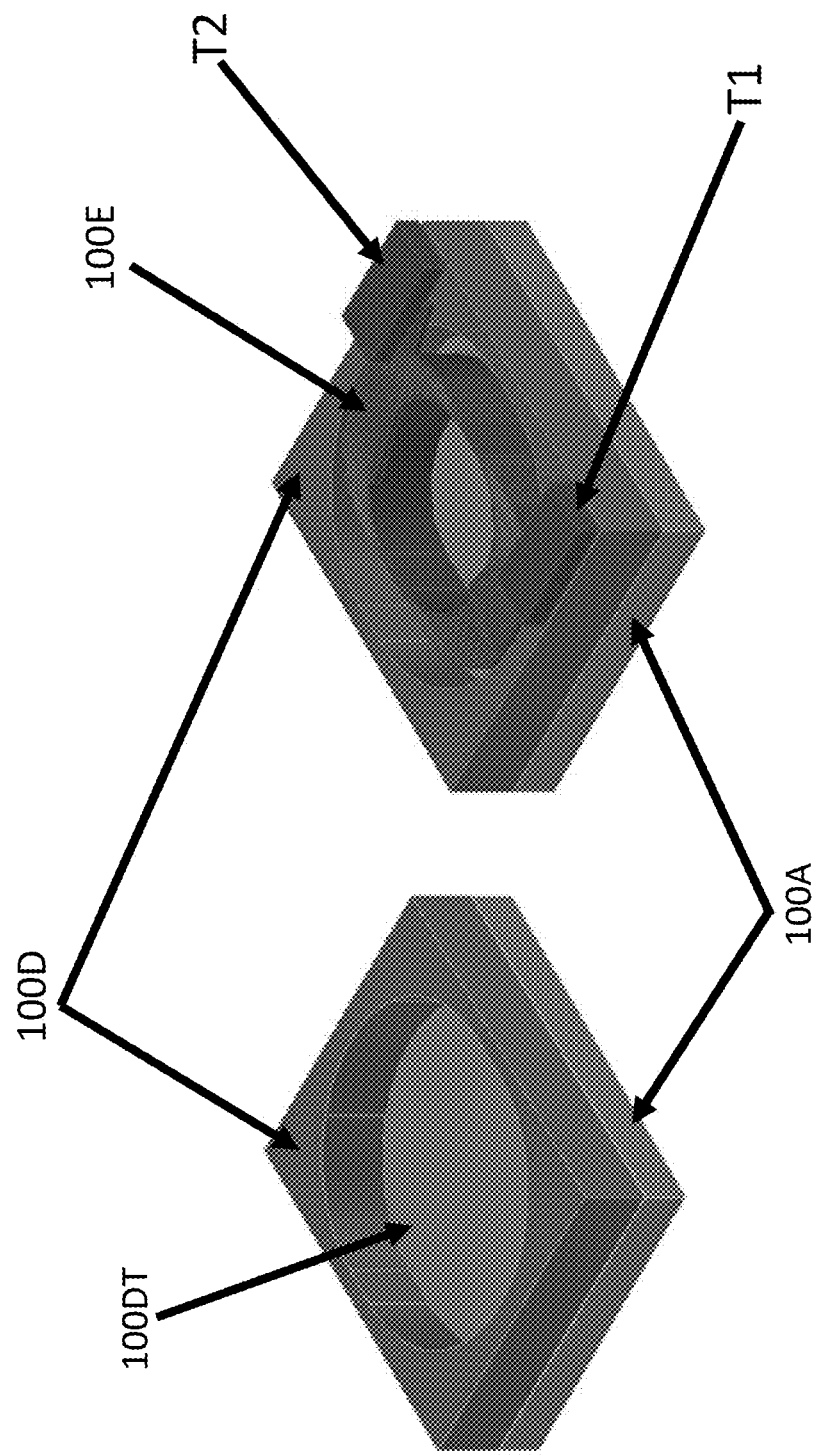

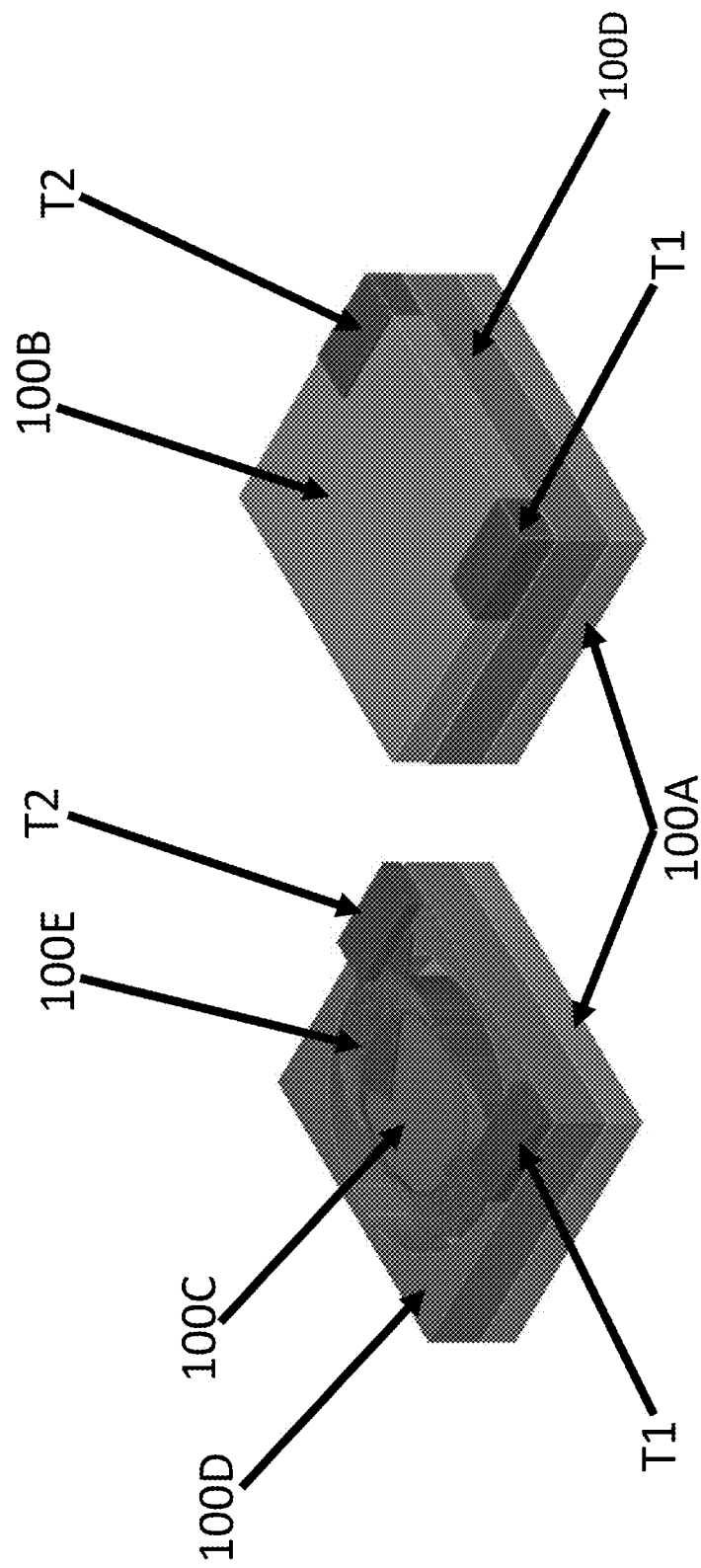

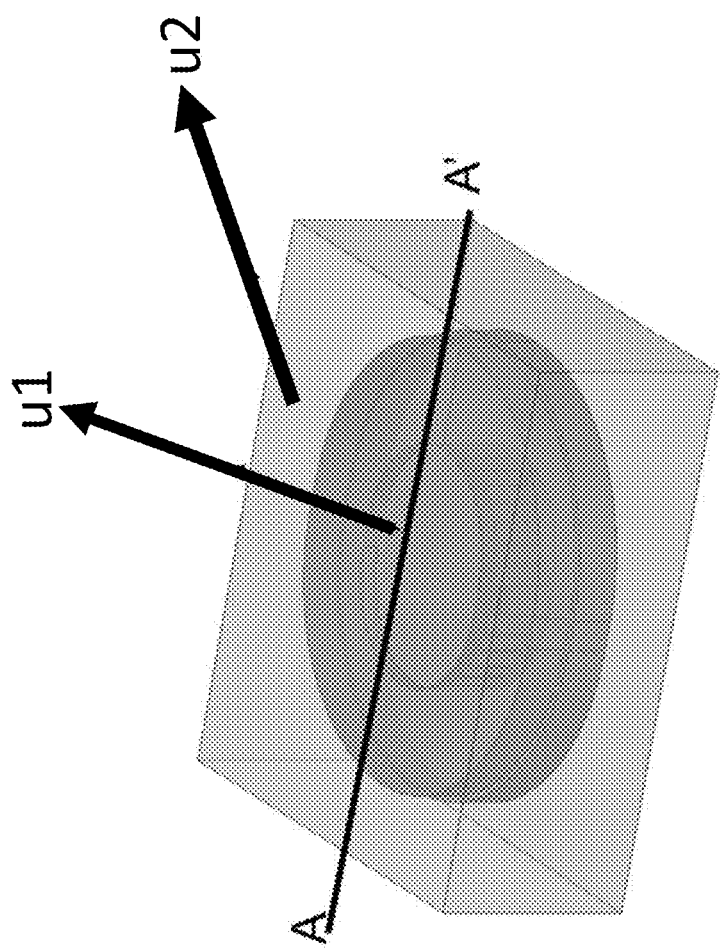

| (μ1) | (μ2) | L |
|---|---|---|
| 60 | 13.5 | 3.03 |
| 52.8 | 15 | 3.03 |
| 51 | 15.5 | 3.04 |
| 49.2 | 16 | 3.03 |
| 48 | 16.5 | 3.04 |
| 44.4 | 18 | 3.04 |
| 42.6 | 19 | 3.04 |
| 40.2 | 20.5 | 3.04 |
| 39.6 | 21 | 3.03 |
| 37.2 | 23.5 | 3.03 |
| 36 | 25 | 3.03 |
| 35.4 | 26 | 3.03 |
| 34.8 | 27 | 3.03 |
| 33.6 | 29.5 | 3.03 |
| 33 | 31.5 | 3.04 |
| 32.4 | 33.5 | 3.04 |

METHOD TO FORM MULTIPLE ELECTRICAL COMPONENTS AND A SINGLE ELECTRICAL COMPONENT MADE BY THE METHOD

CROSS-REFERENCE TO RELATED APPLICATION

The present application claims the benefit of U.S. Provisional Application Ser. No. 63/065,496 filed on Aug. 14, 2020, which is hereby incorporated by reference herein and made a part of the specification.

BACKGROUND OF THE INVENTION

I. Field of the Invention

The invention relates to a method for forming an inductor, in particular for forming multiple inductors in a single process.

II. Description of the Related Art

Conventional power inductor is made by filling a magnetic powder into a single-piece mold with a coil placed therein, and then formed by high-tonnage pressing or heating. Due to the space limitation of the single-piece mold, the particle size of the magnetic powder must be kept below an appropriate particle size to avoid the bridging effect hindering the accumulation of the powder as well as to increase the fluidity and filling density of the magnetic powder. Furthermore, due to the limitation of the pressing process, glue material to bind the powder needs to be held below an appropriate ratio to avoid the glue material from sticking to the mold and causing damage to the mold.

Furthermore, the conventional power inductor is made by pressing filled magnetic powder with a coil wound around a bump or pillar, after which a lead frame is used for forming electrodes of the power inductor. However, the use of lead frames requires a large amount of space, which is not suitable as electrodes for smaller electrical components, such as the power inductor. In addition, due to the difference of the pressure between the bump and the filled magnetic powder, the coil is easily deformed after being heated and pressed, thereby causing particles of the magnetic powder to penetrate into the insulating layer of the coil, which can cause short circuits and increase resistance of the coil.

Accordingly, there is demand for a better solution to solve these problems.

SUMMARY OF THE INVENTION

One objective is to provide a method for forming a plurality of inductors in a single process to save cost and time for mass production.

One objective is to provide a method for forming an inductor in a single process by assembly different parts that are separately formed, for adjusting the inductance of an inductor through choosing appropriate materials for each part, respectively.

One objective is to provide a method for forming a plurality of inductors in a single process without using a single-piece mold, thereby avoiding the afore-mentioned problems in the prior art.

In one embodiment, an electrical component is disclosed, wherein the electrical component comprises: a magnetic body and a coil disposed in the magnetic body, wherein the magnetic body is formed by a plurality of parts, each part being pre-formed separately from each other, wherein the plurality of parts comprises a first part comprising a base, a second part comprising a pillar, a third part comprising a through opening, and a fourth part comprising a cover, wherein a bottom surface of the pillar is disposed over a top surface of the base with at least one portion of the pillar being placed in a hollow space of the coil, wherein the third part is disposed over the top surface the base with the pillar and the coil being placed in said through openings, wherein the cover is disposed over the pillar and the coil with the base and the cover being located on two opposite sides of the bottom surface of the pillar.

In one embodiment, the electrical component is an inductor.

In one embodiment, the base is made of a first magnetic material and the pillar is made of a second magnetic material, wherein the first magnetic material and the second magnetic material are different magnetic materials, wherein a permeability of the second magnetic material is different from a permeability of the first magnetic material.

In one embodiment, a permeability of the second magnetic material is greater than a permeability of the first magnetic material.

In one embodiment, the third part is made of a third magnetic material, wherein the first magnetic material, the second magnetic material and the third magnetic material are different from each other.

In one embodiment, the cover is made of a fourth magnetic material, wherein the first magnetic material, the second magnetic material, the third magnetic material and the fourth magnetic material are different from each other.

In one embodiment, the first magnetic material comprises a first magnetic powder, and the D50 of the first magnetic powder is in a range of 0.5 um to 50 um.

In one embodiment, the second magnetic material comprises a second magnetic powder, and the D50 of the second magnetic powder is in a range of 0.5 um to 50 um.

In one embodiment, the first magnetic material comprises a first magnetic powder and a second magnetic powder, wherein a ratio of the D50 of the first magnetic powder to the D50 of the second magnetic powder is equal to or greater than 7.

In one embodiment, the second magnetic material comprises at least one magnetic powder and a polymer material, wherein the at least one magnetic powder weights 3~8 wt % of a total weight of the at least one first magnetic powder and the polymer material.

In one embodiment, the second magnetic material comprises at least one first magnetic powder and polymer material, wherein the at least one magnetic powder weights 4~6 wt % of a total weight of the at least one first magnetic powder and the polymer material.

In one embodiment, the first magnetic powder comprises at least one of the following: Mn and Zn.

In one embodiment, the first magnetic powder comprises Mn and Zn.

In one embodiment, the second magnetic material comprises at least one of the following: Ni, Zn and ferrite.

In one embodiment, the second magnetic material comprises Ni, Zn and ferrite.

In one embodiment, the second magnetic material comprises synthetic sintered bulk material.

In one embodiment, the base has a first opening and a second opening at two corners of the base.

In one embodiment, the base has a T shape, wherein a first opening and a second opening are formed at two corners of the base.

In one embodiment, the base has a substantially flat top surface.

In one embodiment, the cover has a I shape.

In one embodiment, the coil is a pre-wound coil, wherein the pre-wound coil is disposed on the base and surrounding the pillar.

In one embodiment, the pillar has a permeability u1 and the base, the cover and the third part have a same permeability u2, wherein the permeability u1 is not equal to the permeability u2.

In one embodiment, the coil is a pre-wound coil.

In one embodiment, an electrical component is disclosed, wherein the electrical component comprises: a magnetic body and a coil disposed in the magnetic body, wherein the magnetic body is formed by a plurality of parts, wherein the plurality of parts comprises a first part comprising a base, a second part comprising a pillar, a third part comprising a through opening, and a fourth part comprising a cover, wherein a bottom surface of the pillar is disposed over a top surface of the base with at least one portion of the pillar being placed in a hollow space of the coil, wherein the third part is disposed over the top surface the base with the pillar and the coil being placed in said through openings, wherein the cover is disposed over the pillar and the coil with the base and the cover being located on two opposite sides of the bottom surface of the pillar, wherein the base is made of a first magnetic material and the pillar is made of a second magnetic material, wherein the first magnetic material and the second magnetic material are different magnetic materials, wherein a permeability of the second magnetic material is different from a permeability of the first magnetic material.

In one embodiment, a method to form an electrical component is disclosed, said method comprising: forming a first magnetic sheet, wherein a plurality of bases are formed in the first magnetic sheet; forming a second magnetic sheet, wherein a plurality of pillars are formed in the second magnetic sheet; forming a third magnetic sheet, wherein a plurality of through openings are formed in the third magnetic sheet; and forming a fourth magnetic sheet, wherein a plurality of covers are formed in the fourth magnetic sheet; stacking the first magnetic sheet, the second magnetic sheet, the third magnetic sheet and the fourth magnetic sheet for forming a magnetic body with a plurality of coils disposed in the magnetic body, wherein a bottom surface of each pillar is disposed over a top surface of a corresponding base with at least one portion of the pillar being placed in a hollow space of a corresponding coil; the third part is disposed over the top surface of said base with said pillar and said coil being placed in a corresponding through openings; and a corresponding cover is disposed over said pillar and said coil; and cutting the magnetic body into a plurality of pieces with each piece comprising a corresponding coil encapsulated by a corresponding portion of the magnetic body.

BRIEF DESCRIPTION OF THE DRAWINGS

The present invention can be more fully understood by reading the subsequent description and examples with references made to the accompanying drawings, wherein:

FIG. 2A shows a magnetic sheet that can be used to form a particular part for forming a magnetic body of the electrical component in accordance with an embodiment of the invention;

FIG. 2B shows the magnetic sheet can be used to form base parts in quantities in accordance with an embodiment of the invention;

FIG. 2C shows the magnetic sheet can be used to form pillar parts in quantities in accordance with an embodiment of the invention;

FIG. 2D shows the magnetic sheet can be used to form hollow parts with through openings therein in quantities in accordance with an embodiment of the invention;

FIG. 2E shows the magnetic sheet can be used to form cover parts in quantities in accordance with an embodiment of the invention;

FIG. 3 illustrates a flow chart of a method to form an electrical component according to one embodiment of present invention;

FIG. 4A-4E shows a process for forming the magnetic body of the inductor in accordance with one embodiment of the invention;

FIG. 4F shows a protecting layer coated on the magnetic body in accordance with an embodiment of the invention;

FIG. 4H shows a copper layer and/or tin layer is overlaid on the terminal parts of the conductive wire after the internal conductors of the terminal parts are exposed from the magnetic body in accordance with an embodiment of the invention;

FIG. 5A-5D shows another process for assembly the parts to form the magnetic body of the inductor in accordance with one embodiment of the invention.

FIG. 6A illustrates a top view of an electrical component according to one embodiment of present invention;

FIG. 6C illustrates a table of permeabilities between the pillar and other parts of the magnetic body according to one embodiment of present invention.

DETAILED DESCRIPTION OF THE INVENTION

Figure 1:
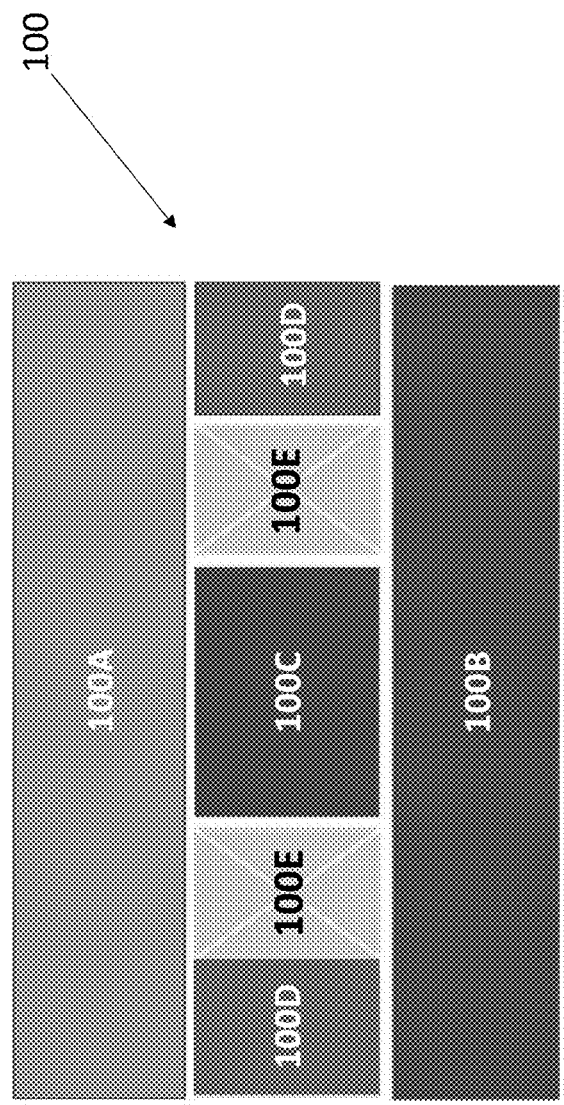
FIG. 1 illustrates a side view of an electrical component according to one embodiment of present invention.

It is understood that the following disclosure provides many different embodiments, or examples, for implementing different features of the invention. Specific examples of devices and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features are formed between the first and second features, such that the first and second features are not in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 illustrates a side view of an electrical component 100, wherein the electrical component 100 comprises: a magnetic body and a coil 100E disposed in the magnetic body, wherein the magnetic body is formed by a plurality of parts 100A, 100B, 100C, 100D, wherein the plurality of parts 100A, 100B, 100C, 100D comprises a first part 100B comprising a base, a second part 100C comprising a pillar, a third part 100D comprising a through opening therein, and a fourth part 100A comprising a cover, wherein a bottom surface of the pillar of the second part 100C is disposed over a top surface of the base of the first part 100B with at least one portion of the pillar of the second part 100C being placed in a hollow space of the coil 100E, wherein the third part 100D is disposed over the top surface the base of the first part 100B with the pillar of the second part 100C and the coil 100E being placed in said through opening of the third part 100D, wherein the cover of the fourth part 100A is disposed over the pillar of the second part 100C and the coil 100E with the base of the first part 100B and the cover of the fourth part 100A being located on two opposite sides of said bottom surface of the pillar of the second part 100C. In one embodiment, each part is pre-formed separately from each other.

FIG. 2A shows a magnetic sheet 100S that can be used to form a particular part for forming a magnetic body of the electrical component in accordance with an embodiment of the invention.

For example, the magnetic sheet 100S can be used to form the first part 100B in quantities, wherein in each unit 100U of the magnetic sheet 100S has the first part 100B comprising a base, as shown in FIG. 2B.

For example, another magnetic sheet 100S can be used to form the second part 100C in quantities as shown in FIG. 2C, wherein in each unit 100U of the magnetic sheet 100S has the second part 100C comprising a pillar.

For example, another magnetic sheet 100S can be used to form the third part 100D in quantities, wherein in each unit 100U of the magnetic sheet 100S has the third part 100D comprising a through opening 100DT therein, as shown in FIG. 2D.

For example, another magnetic sheet 100S can be used to form the fourth part 100A in quantities as shown in FIG. 2E, wherein in each unit 100U of the magnetic sheet 100S has the fourth part 100D comprising a cover.

Please note that the material of the magnetic sheet 100S can be different for forming different parts of the magnetic body.

In one embodiment, the electrical component 100 is an inductor, such as a choke or a power inductor.

In one embodiment, at least one magnetic powder is mixed with polymer series materials to produce the magnetic sheet by way of scraping; the sheets are then punched or molded to form sheets with different shapes.

Compared with the conventional method, which fills granulated powders into a single-piece mold for making an inductor, the magnetic sheets of the present invention does not need to consider the bulk density of the granulated powder, and the limitation of the fluidity of the granulated powder, as well as the size of the mold which limits the size of the granulated powder.

In the present invention, the powder size can be selected according to the magnetic requirements. When the magnetic sheet is hot pressed, the upper and lower gaskets can be added for isolating with the mold, so the proportion of the polymer material for making the magnetic sheet can be further increased, and the high temperature fluidity of the magnetic sheet can be improved, so that the pressure can be reduced while maintaining the powder bulk density.

In one embodiment, the particle size of the magnetic powder can be selected to achieve the maximum bulk density of the powder. In one embodiment, the D50 of the magnetic powder is in a range of 0.5 um to 50 um.

In one embodiment, the magnetic material forming the magnetic sheet comprises a first magnetic powder and a second magnetic powder, wherein a ratio of the D50 of the first magnetic powder to the D50 of the second magnetic powder is equal to or greater than 7.

In one embodiment, to further improve the high temperature fluidity of the magnetic sheet, the proportion of the polymer material can be further increased. In one embodiment, the powder weights 3-8 wt % of a total weight of the power and the polymer material. In one embodiment, the powder weights 4-6 wt % of a total weight of the power and the polymer material.

In order to improve the characteristics, different shapes of magnetic sheets can be used for making different parts of the inductor, and each sheet can be made of different magnetic powder materials. In one embodiment, the magnetic powder material is iron-based powder or iron-based alloy powder or Fe-based nanocrystalline or amorphous powder.

In one embodiment, the first part 100B comprising the base is made of a first magnetic material and the second part 100C comprising the pillar is made of a second magnetic material, wherein the first magnetic material and the second magnetic material are different magnetic materials.

In one embodiment, the third part 100D comprising the through opening is made of a third magnetic material, wherein the first magnetic material, the second magnetic material and the third magnetic material are different from each other.

In one embodiment, the fourth part 100A comprising the cover is made of a fourth magnetic material, wherein the first magnetic material, the second magnetic material, the third magnetic material and the fourth magnetic material are different from each other.

In one embodiment, the first part 100B comprising the base is made of a first magnetic material, and each of the second part 100C, the third part 100D and the fourth part 100A is made of a second magnetic material, wherein the first magnetic material and the second magnetic material are different magnetic materials.

In one embodiment, the pillar is made of a first magnetic material having a permeability u1 and the other parts are made of a second magnetic material having a permeability u2 that is different from the permeability u1. In one embodiment, the permeability u1 is greater than the permeability u2.

In one embodiment, the first magnetic material comprises at least one magnetic powder and a polymer material, wherein the at least one magnetic powder weights 3~8 wt % of a total weight of the at least one first magnetic powder and the polymer material.

In one embodiment, the first magnetic material comprises at least one first magnetic powder and a polymer material, wherein the at least one magnetic powder weights 4~6 wt % of a total weight of the at least one first magnetic powder and the polymer material.

In one embodiment, the second magnetic material comprises at least one magnetic powder and a polymer material, wherein the at least one magnetic powder weights 3~8 wt % of a total weight of the at least one first magnetic powder and the polymer material.

In one embodiment, the second magnetic material comprises at least one first magnetic powder and a polymer material, wherein the at least one magnetic powder weights 4~6 wt % of a total weight of the at least one first magnetic powder and the polymer material.

In one embodiment, the second magnetic material comprises at least one of the following: Mn and Zn.

In one embodiment, the second magnetic material comprises Mn and Zn.

In one embodiment, the second magnetic material comprises at least one of the following: Ni, Zn and ferrite.

In one embodiment, the second magnetic material comprises Ni, Zn and ferrite.

In one embodiment, the second magnetic material comprises synthetic sintered bulk material.

In one embodiment, as shown in FIG. 2B, the base of the first part 100B has a protrusion B3 extended from a side surface of the base to form a first opening B1 and a second opening B2 at two corners of the base.

In one embodiment, the cover of the fourth part 100A has a I shape.

In one embodiment, the coil 100E is a pre-wound coil, wherein the pre-wound coil is disposed on the base of the first part 100B and surrounding the pillar of the second part 100C.

In one embodiment, a side surface of the terminal part of the conductive wire forming the coil is exposed from said corresponding portion of the magnetic body for forming an electrode of the electrical component.

In one embodiment, a side surface of each of a second portion T1 of the first terminal part and a second portion T2 of the second terminal part of the conductive wire forming the coil 100E is exposed from said corresponding portion of the magnetic body for forming an electrode of the electrical component.

In one embodiment, a bottom view of the magnetic body of the magnetic device, such as an inductor, with two terminal parts T1, T2 of the conductive wire disposed on the bottom surface of the magnetic body.

In one embodiment, a protection layer can be coated on the magnetic body.

In one embodiment, a copper layer is overlaid on the terminal parts T1, T2 of the conductive wire after the internal conductors of the terminal parts are exposed.

In one embodiment, a tin layer can be overlaid on the copper layer.

FIG. 3 illustrates a flow chart of a method to form an electrical component according to one embodiment of present invention, wherein the method comprises: step S101: forming a first magnetic sheet, wherein a plurality of bases are formed in the first magnetic sheet; forming a second magnetic sheet, wherein a plurality of pillars are formed in the second magnetic sheet; forming a third magnetic sheet, wherein a plurality of through openings are formed in the third magnetic sheet; and forming a fourth magnetic sheet, wherein a plurality of covers are formed in the fourth magnetic sheet; step S102: stacking the first magnetic sheet, the second magnetic sheet, the third magnetic sheet and the fourth magnetic sheet for forming a magnetic body with a plurality of coils disposed in the magnetic body, wherein a bottom surface of each pillar is disposed over a top surface of a corresponding base with at least one portion of the pillar being placed in a hollow space of a corresponding coil; the third part is disposed over the top surface of said base with said pillar and said coil being placed in a corresponding through openings; and a corresponding cover is disposed over said pillar and said coil; step S103: cutting the magnetic body into a plurality of pieces with each piece comprising a corresponding coil encapsulated by a corresponding portion of the magnetic body.

In one embodiment, the electrical component 100 is an inductor.

In one embodiment, the first part 100B comprising the base is made of a first magnetic material and the second part 100C comprising the pillar is made of a second magnetic material, wherein the first magnetic material and the second magnetic material are different magnetic materials.

In one embodiment, the third part 100D comprising the through openings is made of a third magnetic material, wherein the first magnetic material, the second magnetic material and the third magnetic material are different from each other.

In one embodiment, the fourth part 100A comprising the cover is made of a fourth magnetic material, wherein the first magnetic material, the second magnetic material, the third magnetic material and the fourth magnetic material are different from each other.

In one embodiment, the first magnetic material comprises a first magnetic powder, and the D50 of the first magnetic powder is in a range of 0.5 um to 50 um.

In one embodiment, the first magnetic material comprises a first magnetic powder and a second magnetic powder, wherein a ratio of the D50 of the first magnetic powder to the D50 of the second magnetic powder is equal to or greater than 7.

In one embodiment, the second magnetic material comprises at least one magnetic powder and polymer material, wherein the at least one magnetic powder weights 3~8 wt % of a total weight of the at least one first magnetic powder and the polymer material.

In one embodiment, the second magnetic material comprises at least one first magnetic powder and polymer material, wherein the at least one magnetic powder weights 4~6 wt % of a total weight of the at least one first magnetic powder and the polymer material.

In one embodiment, the second magnetic material comprises at least one of the following: Mn and Zn.

In one embodiment, the second magnetic material comprises Mn and Zn.

In one embodiment, the second magnetic material comprises at least one of the following: Ni, Zn and ferrite.

In one embodiment, the second magnetic material comprises Ni, Zn and ferrite.

In one embodiment, the second magnetic material comprises synthetic sintered bulk material.

In one embodiment, the coil 100E is a pre-wound coil, wherein the pre-wound coil is disposed on the base of the first part 100B and surrounding the pillar of the second part 100C.

In one embodiment, a permeability of the first magnetic material is greater than a permeability of the second magnetic material.

In one embodiment, the pillar has a permeability u1 and the base, the hollow part, and the cover has a same permeability u2, wherein the permeability u1 is not equal to the permeability u2.

There are many ways to carry out the method, which will be described in below.

First Embodiment

Figure 4D:
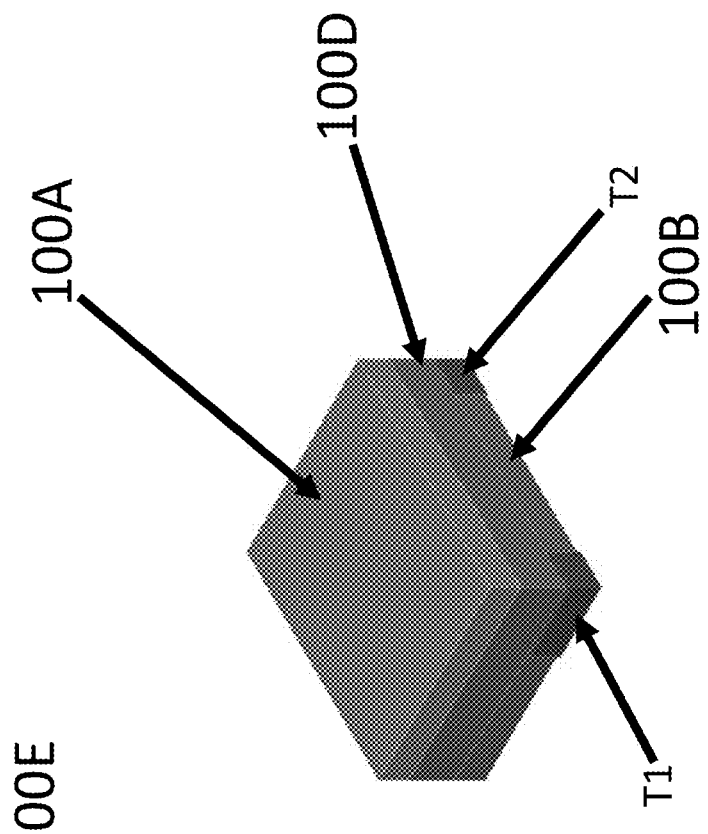
Figure 4C:
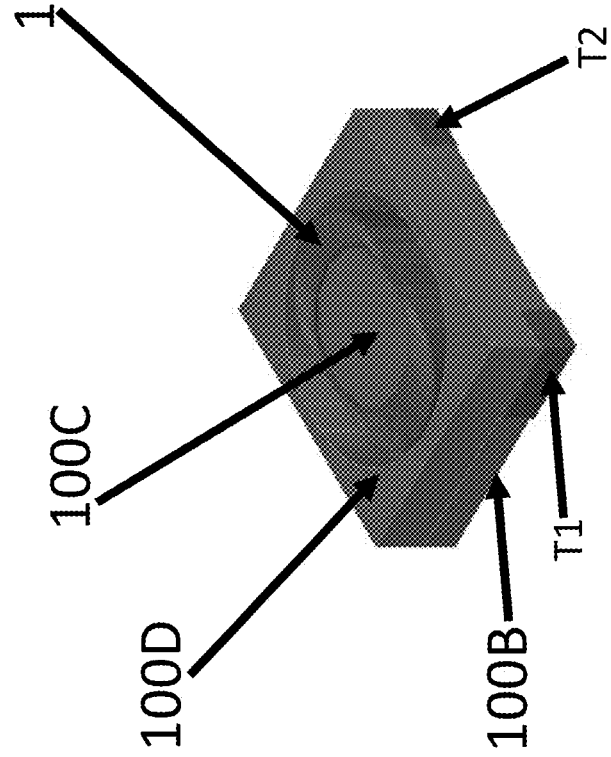
Figure 4E:
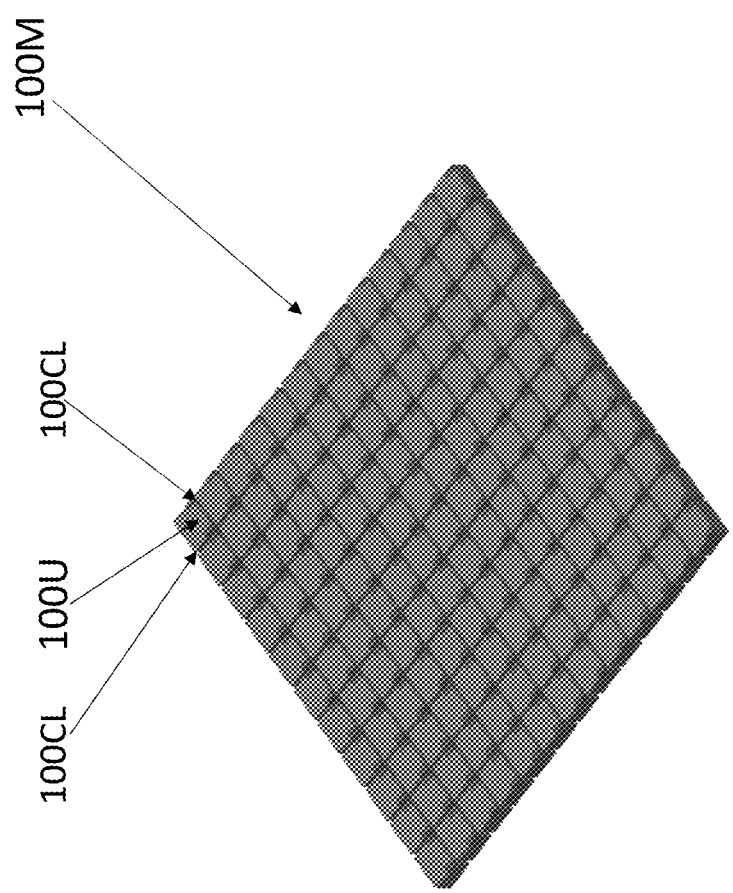

Please refer to FIG. 4A-4J, disposing a plurality of coils on the first magnetic sheet, wherein in each unit of the magnetic sheet, a corresponding coil 100E is disposed on a corresponding base 100B of the first magnetic sheet, as shown in FIG. 4A; then, stacking the second magnetic sheet over the first magnetic sheet, wherein each pillar 100C of the second magnetic sheet is placed in a hollow space of said coil 100E, as shown in FIG. 4B, wherein said coil 100E is formed by a corresponding conductive wire as shown in FIG. 4B, wherein each of a first portion T1P of a first terminal part of the conductive wire and a first portion T2P of a second terminal part of the conductive wire is disposed on the top surface of the base 100B, wherein each of a second portion T1 of the first terminal part and a second portion T2 of the second terminal part is respectively disposed in a corresponding through opening of the base 100B, as shown in FIG. 4B; then, stacking the third magnetic sheet over the first magnetic sheet, wherein the coil 100E is disposed in a corresponding through openings of the hollow part 100D as shown in FIG. 4C; then, stacking the fourth magnetic sheet over the second magnetic sheet and the third magnetic sheet, wherein the fourth magnetic sheet having the cover 100A is placed over the coil 100E and the pillar 100C, as shown in FIG. 4D so as to form a magnetic body; then, the magnetic body 100M can be cut into a plurality of pieces along a plurality of cutting line 100CL, as shown in FIG. 4E, wherein each piece 100U comprises a corresponding coil encapsulated by a corresponding portion of the magnetic body 100MU, as shown in FIG. 4F.

In one embodiment, a protection layer 100PL can be coated on the magnetic body 100MU of the inductor, as shown in FIG. 4F.

Figure 4G:
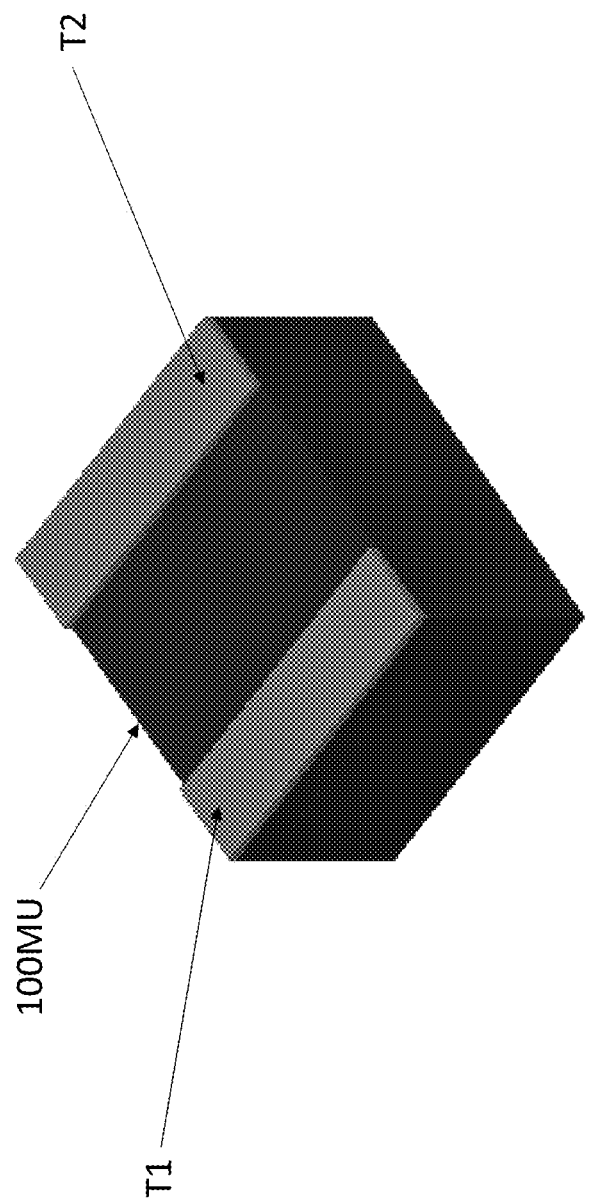
FIG. 4G shows a bottom view of the magnetic body of the inductor with two terminal parts of the conductive wire disposed on the bottom surface of the magnetic body in accordance with an embodiment of the invention.

In one embodiment, each of a second portion T1 of the first terminal part of the conductive wire and a second portion T2 of the second terminal part of the conductive wire of the conductive wire forming the coil 100E is exposed from said corresponding portion of the magnetic body 100MU for forming electrodes of the electrical component, as shown in FIG. 4G.

In one embodiment, the conductive wire forming is a flat wire.

In one embodiment, the conductive wire forming is a round wire.

FIG. 4H shows a copper layer and/or a tin layer 100CT can be overlaid on each of a second portion T1 of the first terminal part of the conductive wire and a second portion T2 of the second terminal part of the conductive wire after the internal conductors of the terminal parts are exposed.

Figure 4I:
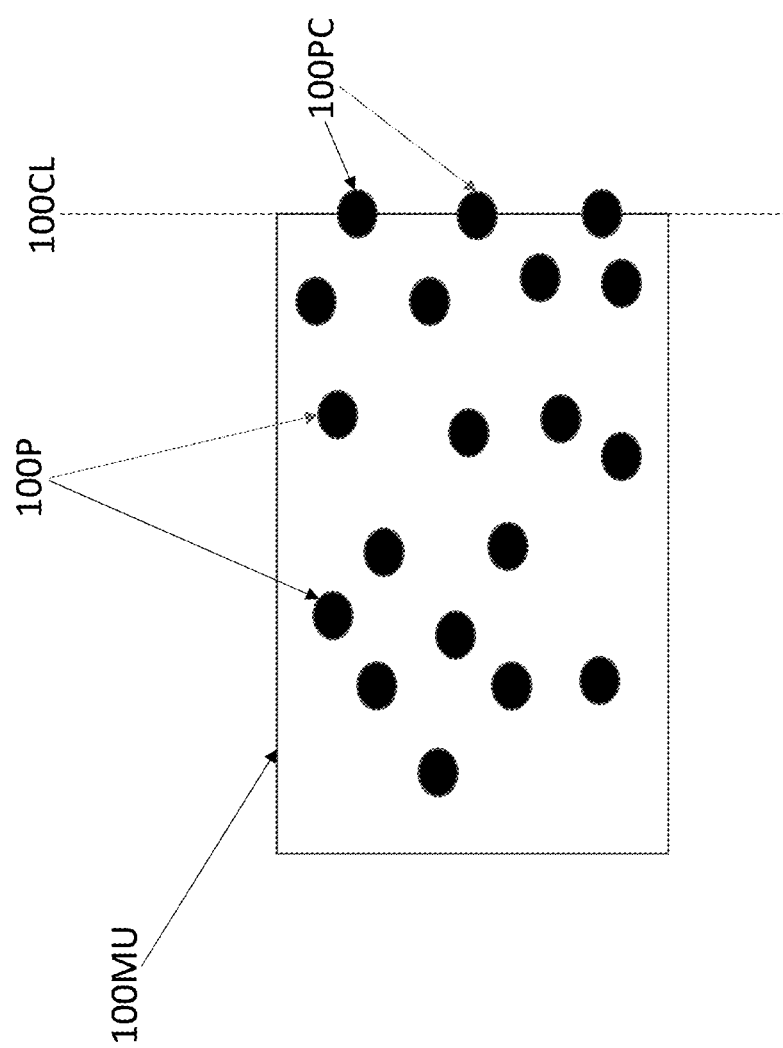
FIG. 4I shows a side view of the magnetic body of the inductor in accordance with one embodiment of the invention.

FIG. 4I shows the shapes of the particles of the magnetic powder inside the magnetic body 100MU in accordance with an embodiment of the invention, wherein each of a first plurality of particles 100P is entirely disposed inside the magnetic body 100MU, and each of a second plurality of particles 100PC is disposed in the magnetic body 100MU with a substantially flat surface being exposed from the magnetic body 100MU after the magnetic body 100M is cut along the cutting line 100CL, as shown in FIG. 4E.

Second Embodiment

Please refer to FIG. 5A-5D, stacking the third magnetic sheet comprising through openings over the fourth magnetic sheet comprising covers, wherein in each unit, the third part 100D having a through opening 100DT is disposed over the cover 100A, as shown in FIG. 5A; then, disposing a plurality of coils on the fourth magnetic sheet, wherein in each unit, a coil 100E is placed in the through opening 100DT, as shown in FIG. 5B; then, stacking the second magnetic sheet over the fourth magnetic sheet, wherein in each unit, a pillar 100C is placed in a hollow space of the coil 100E as shown in FIG. 5C; then, stacking the first magnetic sheet over the second magnetic sheet and the third magnetic sheet so as to form a magnetic body, wherein in each unit, a base of the first part 100B is placed over the pillar 100C and the coil 100E as shown in FIG. 5D; then the magnetic body 100M can be cut into a plurality of pieces along a plurality of cutting line 100CL, as shown in FIG. 4E, wherein each piece 100U comprises a corresponding coil 100E encapsulated by a corresponding portion of the magnetic body 100M.

Other descriptions can be inferred from FIG. 4F-4I and the descriptions of the FIG. 4F-4I in the first embodiment; therefore, it will not be described further for this second embodiment.

In one embodiment of the present invention, said magnetic sheets or magnetic layers can be in semi-cured state before pressing and/or heating said magnetic sheets; and then semi-cured magnetic sheets can be pressed and/or heated to form a solid magnetic body for subsequent cutting step.

FIG. 6A illustrates a top view of an electrical component according to one embodiment of present invention, wherein line AA' is a horizonal line passing the magnetic body, wherein the pillar of the magnetic body has a permeability u1 and the rest of the magnetic body has a same permeability u2.

Figure 6B:
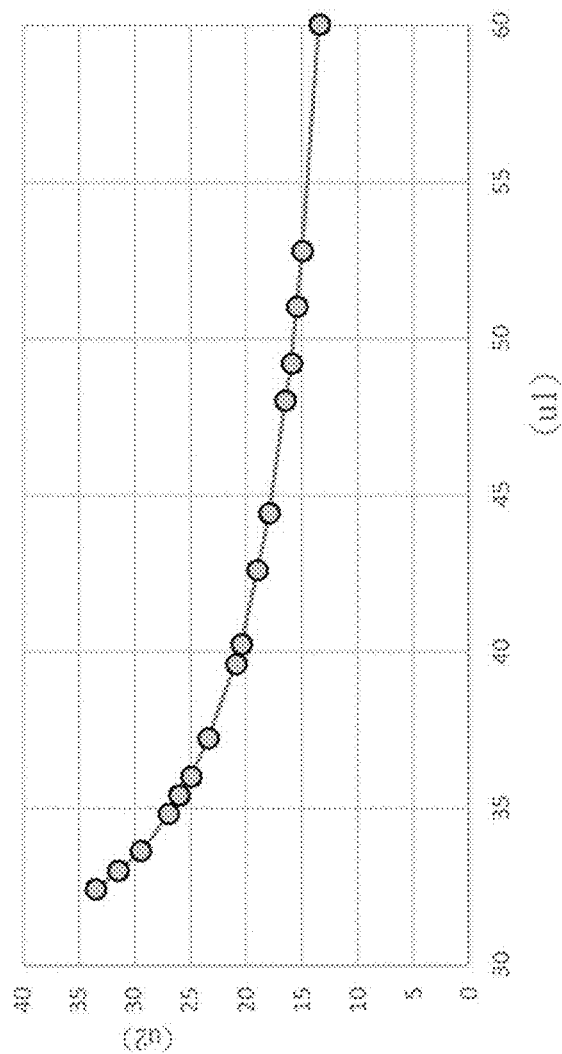
FIG. 6B illustrates a curve of permeabilities between the pillar and other parts of the magnetic body according to one embodiment of present invention.

FIG. 6B illustrates a curve of permeabilities between the permeability u1 of the pillar and the permeability u2 of the other parts of the magnetic body to derive a substantially fixed inductance L of the inductor as shown in FIG. 6C. By choosing appropriate permeabilities between the pillar and the rest of the magnetic body, one can adjust the inductance L of the inductor easily.

From the foregoing, it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

What is claimed is:

1. An electrical component, comprising: a magnetic body and a coil disposed in the magnetic body, wherein the magnetic body is formed by a plurality of separate parts, wherein the plurality of separate parts comprise a first part comprising a base, a second part comprising a pillar, a third part comprising a through opening, and a fourth part comprising a cover, wherein a bottom surface of the pillar is in contact with a top surface of the base with at least one portion of the pillar being placed in a hollow space of the coil, wherein the third part is in contact with the top surface of the base with the coil and at least one portion of the pillar being placed in said through opening of the third part, wherein the cover is in contact with the pillar and the coil with the base and the cover being located on two opposite sides of the bottom surface of the pillar, wherein each of the first part, the second part, the third part having a unitary magnetic body, and the fourth part is pre-formed and made separately with a top surface of said unitary magnetic body comprising said through opening being in contact with a bottom surface of the cover and a bottom surface of said unitary magnetic body comprising said through opening being in contact with the top surface of the base, wherein the coil is formed by a conductive wire, wherein a first portion of a first terminal part of the conductive wire is disposed on the top surface of the base and located below said bottom surface of said unitary magnetic body comprising said through opening, wherein the first part comprising the base is made of a first magnetic material, the second part comprising the pillar is made of a second magnetic material, the third part comprising the through opening is made of a third magnetic material and the fourth part comprising the cover is made of a fourth magnetic material with the first magnetic material, the second magnetic material, the third magnetic material and the fourth magnetic material being different from each other with a permeability of the second magnetic material being greater than a permeability of the first magnetic material.

2. The electrical component according to claim 1, wherein the first magnetic material comprises a first magnetic powder, and the D50 of the first magnetic powder is in a range of 0.5 um to 50 um.

3. The electrical component according to claim 1, wherein the first magnetic material comprises a first magnetic powder and a second magnetic powder, wherein a ratio of the D50 of the first magnetic powder to the D50 of the second magnetic powder is equal to or greater than 7.

4. The electrical component according to claim 1, wherein the first magnetic material comprises at least one magnetic powder and a polymer material, wherein the at least one magnetic powder weighs 3~8 wt % of a total weight of the at least one first magnetic powder and the polymer material.

5. The electrical component according to claim 1, wherein the second magnetic material comprises at least one first magnetic powder and a polymer material, wherein the at least one magnetic powder weighs 3~8 wt % of a total weight of the at least one first magnetic powder and the polymer material.

6. The electrical component according to claim 1, wherein a first portion of a second terminal part of the conductive wire is disposed on the top surface of the base and located below said bottom surface of said unitary magnetic body comprising said through opening.

7. The electrical component according to claim 6, wherein a first opening and a second opening are formed at two corners of the base, wherein a second portion of the first terminal part of the conductive wire and a second portion of the second terminal part of the conductive wire pass through the first opening and the second opening to a bottom surface of the magnetic body, respectively.

8. The electrical component according to claim 1, wherein the coil is a pre-wound coil.

9. An inductor, comprising: a magnetic body and a coil disposed in the magnetic body, wherein the magnetic body is formed by a plurality of separate parts, wherein the plurality of separate parts comprise a first part comprising a base, a second part comprising a pillar, a third part comprising a through opening, and a fourth part comprising a cover, wherein a bottom surface of the pillar is in contact with a top surface of the base with at least one portion of the pillar being placed in a hollow space of the coil, wherein the third part is in contact with the top surface the base with the coil and at least one portion of the pillar being placed in said through opening of the third part, wherein the cover is in contact with the pillar and the coil with the base and the cover being located on two opposite sides of the bottom surface of the pillar, wherein the base is made of a first magnetic material and the pillar is made of a second magnetic material, wherein the first magnetic material and the second magnetic material are different magnetic materials, wherein each of the first part, the second part, the third part having a unitary magnetic body, and the fourth part is pre-formed and made separately with a top surface of said unitary magnetic body comprising said through opening being in contact with a bottom surface of the cover and a bottom surface of said unitary magnetic body comprising said through opening being in contact with the top surface of the base, wherein the coil is formed by a conductive wire, wherein a first portion of a first terminal part of the conductive wire is disposed on the top surface of the base and located below said bottom surface of said unitary magnetic body comprising said through opening, wherein the first part comprising the base is made of a first magnetic material, the second part comprising the pillar is made of a second magnetic material, the third part comprising the through opening is made of a third magnetic material and the fourth part comprising the cover is made of a fourth magnetic material with the first magnetic material, the second magnetic material, the third magnetic material and the fourth magnetic material being different from each other with a permeability of the second magnetic material being greater than a permeability of the first magnetic material.

10. The inductor according to claim 9, wherein the coil is a pre-wound coil.

11. The electrical component according to claim 9, wherein a first portion of a second terminal part of the conductive wire is disposed on the top surface of the base and located below said bottom surface of said unitary magnetic body comprising said through opening.

12. The electrical component according to claim 11, wherein a first opening and a second opening are formed at two corners of the base, wherein a second portion of the first terminal part of the conductive wire and a second portion of the second terminal part of the conductive wire pass through the first opening and the second opening to a bottom surface of the magnetic body, respectively.

* * * * *